United States Patent
Blakely et al.

(10) Patent No.: US 9,001,476 B2
(45) Date of Patent: Apr. 7, 2015

(54) MULTIMOTOR VARIABLE FREQUENCY OVERLOAD

(71) Applicant: Rockwell Automation Technologies, Inc., Mayfield Heights, OH (US)

(72) Inventors: John Blakely, Weaverville, NC (US); Gregory A Helton, Asheville, NC (US); Mark Innes, Asheville, NC (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 1 day.

(21) Appl. No.: 13/834,500

(22) Filed: Mar. 15, 2013

(65) Prior Publication Data

US 2014/0268432 A1    Sep. 18, 2014

(51) Int. Cl.
| | | |
|---|---|---|
| F21V 7/04 | (2006.01) | |
| H02H 6/00 | (2006.01) | |
| H02H 7/08 | (2006.01) | |
| H02H 7/085 | (2006.01) | |
| H02P 29/00 | (2006.01) | |
| G01R 31/34 | (2006.01) | |
| H02H 3/00 | (2006.01) | |

(52) U.S. Cl.
CPC .......... *H02H 7/0822* (2013.01); *G01R 31/343* (2013.01); *H02H 3/006* (2013.01); *H02H 6/00* (2013.01); *H02H 7/085* (2013.01); *H02P 29/0055* (2013.01)

(58) Field of Classification Search
USPC .......................................... 361/31
See application file for complete search history.

(56) References Cited

U.S. PATENT DOCUMENTS

| | | | |
|---|---|---|---|
| 4,266,190 A * | 5/1981 | Lipman ..................... 324/117 R |
| 4,413,213 A | 11/1983 | Baumgarten, Jr. | |
| 4,544,982 A * | 10/1985 | Boothman et al. .............. 361/96 |
| 4,553,187 A * | 11/1985 | Burns et al. ..................... 361/96 |
| 2005/0270707 A1 | 12/2005 | Plemmons et al. | |
| 2006/0126250 A1 | 6/2006 | Sychra et al. | |
| 2009/0027047 A1* | 1/2009 | Kinzel .......................... 324/235 |
| 2010/0083680 A1* | 4/2010 | Tolbert et al. .................... 62/215 |
| 2010/0177451 A1* | 7/2010 | Tang et al. ........................ 361/31 |
| 2012/0092797 A1* | 4/2012 | Reeder et al. ..................... 361/31 |
| 2012/0299520 A1* | 11/2012 | Krupke et al. ................. 318/473 |
| 2013/0027817 A1* | 1/2013 | Keeramthode et al. .......... 361/31 |
| 2013/0070373 A1* | 3/2013 | Jefferies .......................... 361/31 |
| 2013/0083434 A1* | 4/2013 | Barth ............................... 361/31 |

FOREIGN PATENT DOCUMENTS

| | | |
|---|---|---|
| EP | 0664594 A1 | 7/1995 |
| GB | 590379 | 7/1947 |
| WO | 9902997 | 1/1999 |

* cited by examiner

*Primary Examiner* — Forrest M Phillips
(74) *Attorney, Agent, or Firm* — Kunzler Law Group

(57) ABSTRACT

An apparatus for protecting a motor includes two or more motor overloads, within a motor overload enclosure, protecting two or more motors. Each motor overload includes one or more current sensors where each current sensor includes a magnetic core and each current sensor includes a conductor positioned within the magnetic core where the conductor providing power to a motor protected by the two or more motor overloads ("protected motor"). Each motor overload includes a motor trip module that stops current flow to the protected motor in response determining that a thermal state of the protected motor has reached a thermal limit. Determining that the protected motor has reached a thermal limit includes using a current signal from at least one current sensor of the one or more current sensors that senses current of the protected motor to determine a thermal state of the protected motor.

19 Claims, 6 Drawing Sheets

MULTIMOTOR VARIABLE FREQUENCY OVERLOAD

FIELD

The subject matter disclosed herein relates to motor protection and more particularly relates to protecting motors in a group motor environment.

BACKGROUND

Description of the Related Art

Alternating current ("AC") electric motors are very common and are used in a wide variety of applications, including industrial applications. AC electric motors often are single-phase and three-phase. A common trait of AC electric motors is that at startup, the motors draw a higher current than the current drawn while in operation. A branch circuit providing power to an AC electric motor often includes a branch circuit overcurrent protection device (typically a circuit breaker or fuse) sized higher than a rated full load amperes rating of the motor and typically branch circuit conductors feeding the motor are sized lower than the rating of the branch circuit overcurrent protection device.

Typically a motor overload or similar device is used to protect the AC electric motor and conductors for currents below the rating of the branch circuit overcurrent protection device protecting the AC electric motor. A motor overload or similar device often functions based on temperature and works to prevent the motor from overheating. One type of motor overload is resettable after cooling. Another type is not resettable after tripping. Many motor overloads are mechanical in nature and often trip without providing any advanced warning.

Typical AC electric motors do not include a motor overload. Some AC electric motors include a motor overload, but inclusion of a motor overload typically increases the cost of a motor. Another type of motor overload is external to the motor and may be in a motor controller, such as a motor starter or variable frequency drive. Traditionally, a motor controller controls a single motor. While group motor installations have been allowed by the National Electrical Code ("NEC"), recent changes have made such installations more practical.

BRIEF SUMMARY

An apparatus for protecting a motor is disclosed. A method and system also perform the functions of the apparatus. The apparatus includes a motor overload enclosure and two or more motor overloads protecting two or more motors. Each motor overload of the two or more motor overloads is located within the motor overload enclosure and each of the two or more motor overloads is external to an enclosure housing a motor of the two or more motors. Each motor overload includes one or more current sensors where each current sensor includes a magnetic core and each current sensor includes a conductor positioned within the magnetic core where the conductor providing power to a motor protected by the two or more motor overloads ("protected motor"). Each motor overload includes a motor trip module that stops current flow to the protected motor in response determining that a thermal state of the protected motor has reached a thermal limit. Determining that the protected motor has reached a thermal limit includes using a current signal from at least one current sensor of the one or more current sensors that senses current of the protected motor to determine a thermal state of the protected motor.

In one embodiment, the two or more motor overloads within the motor overload enclosure are listed for group motor installation with the National Electrical Code section 430.53. In another embodiment, the two or more motors are controlled by a single motor controller where each output conductor of the motor controller is divided to feed each of the two or more motors. In another embodiment, the motor controller includes a variable frequency drive. In another embodiment, each current sensor of the two or more current sensors senses current of a motor within a full current range of the motor while the motor operates within a frequency range of the current from direct current ("DC") to a current with a fundamental frequency that is at least a full rated frequency of the motor.

In another embodiment, the motor controller and the two or more motor overloads are within a common enclosure. In another embodiment, power used by the motor controller to power the two or more motors comes from a set of conductors protected by a single branch circuit overcurrent protection device. In another embodiment, a summation of rated currents for each of the two or more motors is less than or equal to a current rating for the motor controller.

In one embodiment, the current sensor includes a closed magnetic core and the closed magnetic core is a saturable core current sensor. In a further embodiment, the closed magnetic core of the saturable core current sensor saturates for at least a portion of a range of motor currents below a full load current of the protected motor. In the embodiment, the apparatus includes a current reading module that periodically drives the magnetic core of the saturable core current sensor into an unsaturated state and the saturable core current sensor reads current of the magnetic core while the magnetic core is in the unsaturated state. The current reading module drives the magnetic core into the unsaturated state at a sampling rate. The sampling rate at a frequency is higher than a maximum fundamental frequency of an alternating current ("AC") frequency of a voltage on the conductors providing power to the protected motor.

In one embodiment, the one or more current sensors for the motor overload protecting the protected motor include a current sensor for each line voltage phase providing power to the protected motor. In another embodiment, the motor trip module includes a speed adjustment module that adjusts the thermal limit as a function of motor speed. In a further embodiment, the speed adjustment module adjusts the thermal limit as a function of motor speed by accounting for a reduced cooling effect when the protected motor operates at a speed below a rated full speed. In another embodiment, each motor trip module stops flow to the protected motor by adjusting power to a coil of a contactor of a motor starter to open the contactor or commands a variable frequency drive powering the two or more motors to a state where power to the two or more motors is interrupted. In another embodiment, the two or more motors are of different sizes. In another embodiment, the apparatus includes an overload module that displays a reading of how close the protected motor is to reaching the thermal limit.

A method for protecting a motor includes sensing current for a protected motor. The protected motor is a motor of two or more motors and each of the two or more motors is protected by a motor overload. Each motor overload protecting the two or more motors is within a motor overload enclosure and each motor overload includes one or more current sensors that sense current for the protected motor. Each current sensor includes a magnetic core and each current sensor includes a conductor positioned within the magnetic core where the conductor provides power to the protected motor.

The method includes determining a thermal state of the protected motor. Determining a thermal state of the protected motor includes using a current signal from at least one current sensor of the one or more current sensors that senses current of the protected motor to determine the thermal state of the protected motor. The method includes stopping current flow to the protected motor in response determining that the thermal state of the protected motor has reached a thermal limit.

In one embodiment, the magnetic core includes a closed magnetic core and the closed magnetic core is a saturable magnetic core where the saturable magnetic core saturates for at least a portion of a range of motor currents below a full load current of the protected motor. In the embodiment, sensing current for the protected motor includes driving the saturable magnetic core into an unsaturated state at a sampling time. Each sampling time occurs at a sampling rate where the sampling rate is at a frequency higher than a maximum fundamental frequency of an alternating current ("AC") frequency of a voltage on the conductors providing power to the protected motor. In the embodiment, sensing current for the protected motor includes reading current of the saturable magnetic core while the magnetic core is in the unsaturated state and releasing the saturable magnetic core into a saturated state until a next sampling time.

A system for protecting a motor includes an enclosure, a motor controller within the enclosure, and two or more motor overloads protecting the two or more motors. The motor controller controls two or more motors where each output conductor of the motor controller is divided to feed each of the two or more motors. Each motor overload is located within the motor overload enclosure and each of the two or more motor overloads is external to an enclosure housing a motor of the two or more motors. Each motor overload includes one or more current sensors where each current sensor includes a magnetic core and each current sensor includes a conductor positioned within the magnetic core where the conductor provides power to a motor protected by the two or more motor overloads ("protected motor"). Each motor overload includes a motor trip module that stops current flow to the protected motor in response determining that a thermal state of the protected motor has reached a thermal limit. Determining that the protected motor has reached a thermal limit includes using a current signal from at least one current sensor of the one or more current sensors that senses current of the protected motor to determine a thermal state of the protected motor. In one embodiment, the system includes the two or more motors protected by the thermal overloads.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
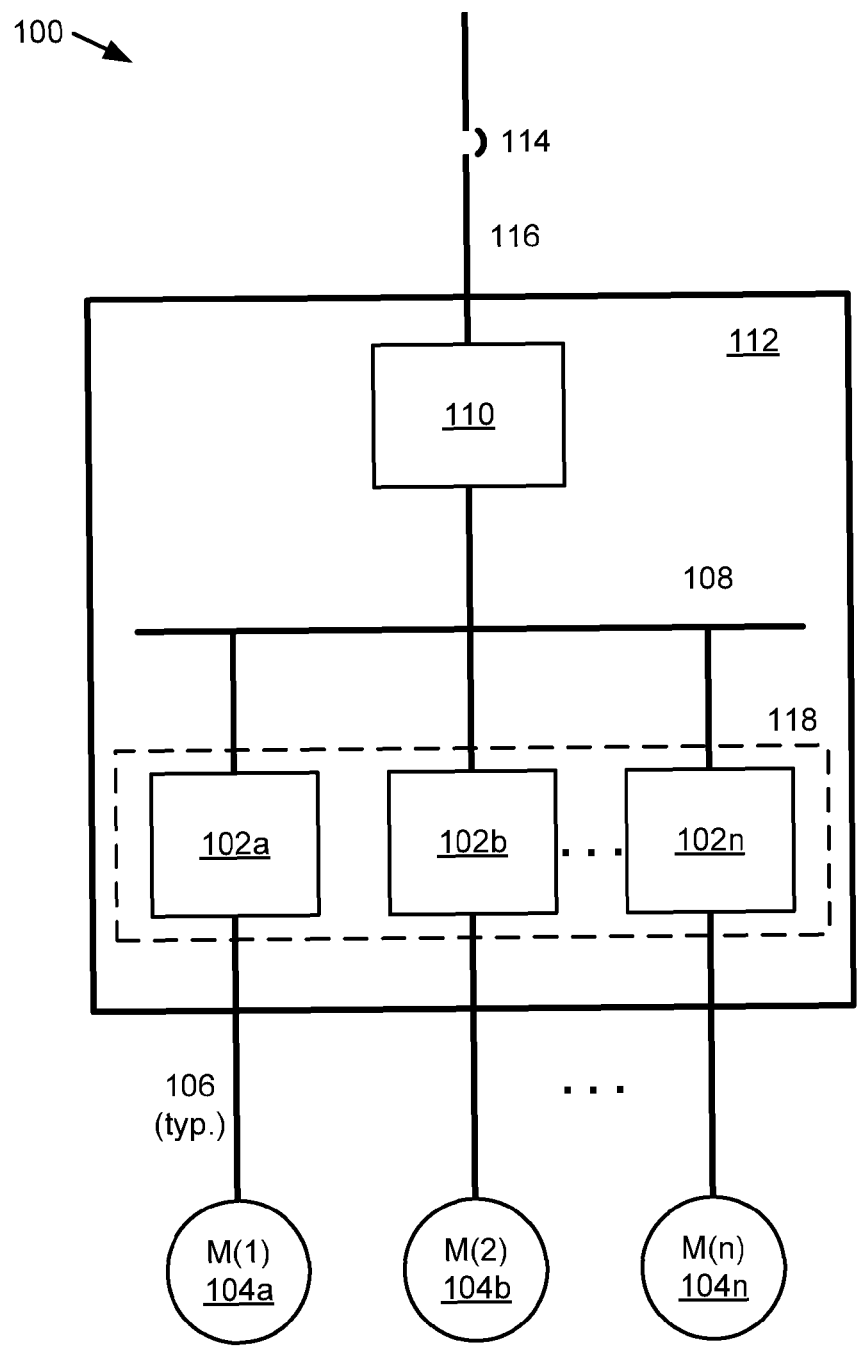
FIG. 1 is a schematic one-line diagram illustrating one embodiment of a system for motor protection.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function.

Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Furthermore, the described features, structures, or characteristics of the embodiments may be combined in any suitable manner. In the following description, numerous specific details are provided, such as examples of programming, software modules, user selections, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 is a schematic one-line diagram illustrating one embodiment of a system 100 for motor protection. The system 100 includes two or more motor overloads 102a-102n (collectively 102), two or more motors 104a-104n (collectively 104), conductors 106, a terminal block 108, a motor controller 110, an enclosure 112, an overcurrent protection device 114, branch circuit conductors 116, and a motor overload enclosure 118, which are described below. The system 100 may be considered, in one embodiment, a group motor installation where two or more motors 104 are protected with a single branch circuit overcurrent protection device 114. In one embodiment, the system 100 is in compliance with section 430.53 of the National Electrical Code® ("NEC").

The system 100 includes two or more motor overloads 102 in protecting the two or more motors 104. In one embodiment, each motor overload (e.g. 102a) of the two or more motor overloads 102 is located within the motor overload enclosure 118. For example, the system 100 may include three motor overloads 102 group together in a motor overload enclosure 118. In other embodiments, a different number of motor overloads 102 are grouped together in a motor overload enclosure 118. In another embodiment, each motor overload (e.g. 102a) is located within the enclosure 112. For example, each motor overload (e.g. 102a) may be packaged separately. In one embodiment, each of the two or more motor overloads 102 is external to an enclosure housing a motor (e.g. 104a) of the two or more motors 104. The motor overloads 102 will be discussed in more detail with respect to the apparatus 200 of FIG. 2, the apparatus 300 of FIG. 3, and the apparatus 400 of FIG. 4.

The system 100 includes two or more motors 104. Each motor (e.g. 104a) is an electric motor and is a type of motor that is protected with motor overload 102. For example, a motor 104a may be an AC electric motor. In another example, a motor 104a may be a direct current ("DC") motor, a stepper motor, or other type of motor may be protected with motor overload 102. A typical AC electric motor often does not include an internal motor overload so a motor overload 102 external to the motor 104a may be used to protect the motor 104a. Each motor 104 is typically fed by a set of conductors 106. In another example, each motor 104 is fed by bus bars or other type of conductor. In one embodiment, the set of conductors 106 are sized based on the current rating of the motor 104a. A branch current overcurrent protection device 114 and associated branch circuit conductors 116, in a group motor installation, is typically sized based on the rating of the motor controller 110 and may be sized larger than the full load current rating of one motor 104a of the two or more motors 104. The set of conductors 106 feeding a motor 104a may have an ampacity rating less than or equal to the rating of the overcurrent protection device 114 or branch circuit conductors 116. In one embodiment, a summation of rated currents for each of the two or more motors 104 is less than or equal to a current rating for the motor controller 110. The motor overload 102a protecting the motor 104a may help to protect the set of conductors 106 feeding the motor 104a.

In one embodiment, the two or more motors 104 are three-phase motors. In another embodiment, the two or more motors 104 are single phase motors or direct current ("DC") motors. In such embodiments, the set of conductors 106 may include a conductor for each phase. Where the two or more motors 104 are single phase or DC motors, the motors 104 may be fed by two line voltage conductors or maybe fed by a line voltage conductor and a neutral conductor.

In one embodiment, the system 100 includes a terminal block 108. The terminal block 108 may include a common bus bar or common conductor such that the two or more motors 102 are fed from a single motor controller 110. In one embodiment, the terminal block 108 includes one or more disconnects or other power distribution devices. The terminal block 108 may include a separate terminal block for each phase, or for a neutral where the two or more motors 104 or single phase motors. In one embodiment, instead of a terminal block 108, the system 100 may include connectors that connect an output conductor of the motor controller 110 to conductors feeding the two or more motors 104. One of skill in the art will recognize other forms of the terminal block 108 that feeds to her more motors 104 from a single motor controller 110.

In one embodiment, the system 100 includes a motor controller 110. The motor controller 110, for example, may be a motor starter. Typically a motor starter includes a contactor with a contact for each phase. The contactor they also include one or more normally open or normally closed coil contacts that control opening and closing of the contacts of the contactor. In one embodiment, the motor overload 102a sends a signal to a coil of the contactor to open the contacts when the motor overload 102a determines an overload condition, such as when a thermal state of the protected motor 104a reaches a thermal limit.

In another embodiment, the motor controller 110 is a variable frequency drive. A variable frequency drive is a type of motor controller that adjusts speed of a motor 104a by adjusting a frequency of an AC voltage waveform powering the motor 104a. For example, a variable frequency drive may generate a fundamental frequency of between 0 hertz ("Hz") and 120 Hz. The motor 104a may respond to the changing frequency by changing the speed of the motor. In one embodiment, the variable frequency drive may allow the motor 104a to be in a stopped position while providing torque to a load connected to the motor 104a. In another embodiment, the variable frequency drive may allow the motor 104a to operate at a reduced speed while providing torque to the load connected to the motor 104a.

Where the motor 104a is operating at a reduced speed or is stopped, torque provided by the motor may cause current to the motor to be above a full load rating or may cause the motor to overheat even when the motor 104a is operating below a full load current. For example, a motor 104a operating at a speed below full load speed may overheat because air drawn through the motor may be reduced at a lower speed. For example, the motor 104a may include blades or other mechanism to draw air through the motor to aid in cooling.

Typically the system 100 includes a branch circuit overcurrent protection device 114 and branch circuit conductors 116 that feed the motor controller 110. In the depicted embodiment, the overcurrent protection device 114 is shown external to an enclosure 112 with the motor controller 110. In another embodiment, an overcurrent protection device 114 may be within an enclosure 112 where the motor controller 110 resides. For example, the motor controller 110 may be included in a motor control center ("MCC"). Typically, the overcurrent protection device 114 is sized to protect the motor controller 110 and the conductors feeding the motor controller 110. One of skill in the art will recognize other configurations with a motor controller 110 in a group motor installation controlling two or more motors 104.

The system 100 depicts an enclosure 112 for the motor overloads 102, terminal block 108 and motor controller 110 reside. Other embodiments may include additional motor controllers 110, motor overloads 102, and other devices in an enclosure 112. For example, an enclosure 112 may be a motor control center with multiple motor controllers 110 and motor overloads 102. In the depicted embodiment, the motor controller 110 and motor overloads 102 may be part of a standalone motor controller installation controlling two or more motors 104. One of skill in the art will recognize other configurations that include a motor controller 110 and accompanying motor overloads 102 protecting two or more motors 104.

In one embodiment, the system 100 includes a motor overload enclosure 118 housing the two or more motor overloads 102. The motor overload enclosure 118, in one embodiment, is an enclosure that houses the motor overloads 102 such that the motor overloads 102 are not exposed. In another embodiment, the motor overload enclosure 118 includes a common structure where the motor overloads 102 are mounted such that the motor overloads 102 are packaged together where the motor overloads 102 may be exposed or enclosed. In another embodiment, the motor overload enclosure 118 allows the motor overloads 102 to remain exposed when the enclosure 112 is opened. As used herein, the motor overload enclosure 118 is a structure where the motor overloads 102 are grouped together. One of skill in the art will recognize other ways to group motor overloads 102 together within a single package that may be called a motor overload enclosure 118.

Figure 2:
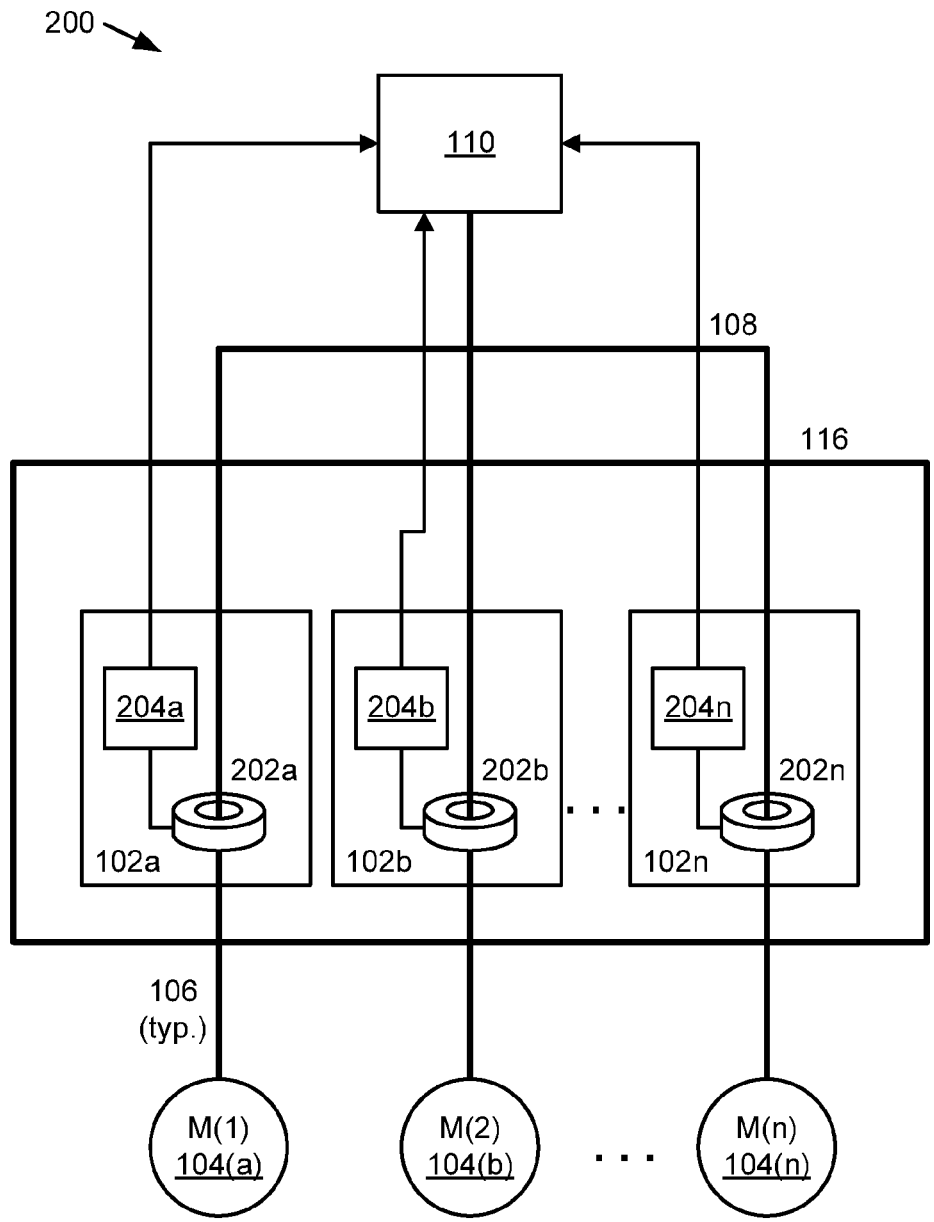
FIG. 2 is a schematic one-line diagram illustrating one embodiment that includes an apparatus for motor protection.

FIG. 2 is a schematic one-line diagram illustrating one embodiment that includes an apparatus 200 for motor protection. The apparatus 200 includes two or more motor overloads 102 combined within a motor overload enclosure 118, which are substantially similar to those described in the system 100 of FIG. 1. FIG. 2 also depicts two or more motors 104, conductors 106 feeding the motors, a terminal block 108 and a motor controller 110, which are substantially similar to those described in the system 100 of FIG. 1. The apparatus 200 also includes a current sensor 202a-202n (collectively 202) and motor trip module 204a-204n (collectively 204) in each motor overload 102, which are described below.

In one embodiment, the apparatus 200 includes a motor overload 102 with one or more current sensors (e.g. 202a). Each current sensor 202a includes a magnetic core where conductor is positioned within the magnetic core. The conductor is part of the set of conductors 106 providing power to a motor (e.g. 104a) protected by the motor overload 102a. The magnetic core is typically made of magnetic material. The magnetic core may be a closed magnetic core or a magnetic core that is not closed. Where the magnetic core is a closed magnetic core, the closed magnetic core is configured such that there is no intentional gap, such as an air gap. For example, the closed magnetic core may be a toroid or similar shaped magnetic core. In other embodiments, the closed magnetic core maybe a combination of a C-core and an I-core positioned to be touching each other, or may be another type of closed magnetic core known to those of skill in the art.

In another embodiment, the magnetic core may be of a type that is not closed. For example, the current sensor 202a may be a Hall effect sensor and the magnetic core for the Hall effect sensor may include a gap. Typically, a Hall effect sensor includes an open core where the Hall is inserted. In the embodiment where the current sensor 202a is a Hall effect sensor, the current sensor 202a beneficially may measure current to the protected motor 104a over a wide range of frequencies and typically may measure DC current. A Hall effect sensor may include undesirable characteristics, such as an offset at DC or may be susceptible to stray magnetic fields and may be suitable for some motor overloads 102 but not for others. A current sensor 202a with a closed magnetic core, in some embodiments, may be less susceptible to stray magnetic fields and may be used at DC.

In one embodiment, each current sensor (e.g. 202a) of the two or more current sensors 202 senses current of a protected motor 104a for a wide range of current and for a wide range of motor speeds. For example, each current sensor 202a may sense current of a motor 104a within a current range of at least zero amperes to beyond a locked rotor current of the motor 104a for a motor speed range from zero to beyond a maximum speed for the motor 104a in both a forward and a reverse direction. In another embodiment, each current sensor 202a may sense current of a motor 104a within a full current range the motor 104a while the motor operates within a frequency range of the current from direct current ("DC") to a current with a fundamental frequency that is at least a full rated frequency of the motor. For example, the current sensor 202a may sense current for the motor 104a from a low current or zero current to at least a full load ampere rating of the motor and beyond while the motor 104 operates at speeds from stopped to beyond a rated speed of the motor 104a. If the motor controller 110 is a variable frequency drive ("VFD"), a frequency of voltage to the motor 104a may vary from DC to above a rated frequency of the motor 104a. For example the motor may be rated at 60 Hz. The operating range of the VFD may be 0 Hz to 120 Hz, or higher. The motor 104a may be stopped while still providing torque and thus may still draw current and the current sensor 202a may sense current from 0 Hz to the upper end frequency of the VFD. For example, a Hall effect sensor or a saturable core current sensor may be included for the expected frequency range. Other types of current sensors 202a may also be used for this frequency range.

In one embodiment, the apparatus 200 includes a current sensor 202a for each conductor in the set of conductors 106 feeding the protected motor 104a. For example, a safety code may require a motor overload 102a for each phase. In another embodiment, the apparatus 200 includes a current sensor 202a for a single phase feeding the protected motor 104a. In this embodiment, the apparatus 200 may assume that current in one phase feeding the protected motor 104a is approximately the same as current in the other phases feeding the protected motor 104a.

In one embodiment, the apparatus 200 includes motor trip module 204 that stops current flow to the protected motor 104a in response to determining that a thermal state of the protected motor 104 has reached a thermal limit. For example, the thermal limit may be temperature limit or heat limit set to protect the motor from damage due to overheating effects. In one embodiment, the motor trip module 204 determines that the current has reached the thermal trip limit by using a current signal from one or more current sensors 202a sensing current of the protected motor 104a to determine a thermal state of the protected motor 104a. Typically, the current of the protected motor 104a correlates to the thermal state of the protected motor 104a. The thermal state is typically related to temperature of the protected motor 104a while in operation. Usually when a motor gets too hot damage to the motor may occur. The thermal limit, in one embodiment, is a limit set by the manufacturer of the protected motor 104a.

In one embodiment, the thermal limit changes with respect to speed of the motor 104. For example, when the motor 104a is operating at a lower speed the motor 104a may draw less air and may have a reduced cooling capacity. The motor trip module 204, in one embodiment, includes data that reflects a reduced cooling capacity at lower speed. The motor trip module 204 may incorporate the data to change the thermal limit.

In one embodiment, the two or more motor overloads 102 within the motor overload enclosure 118 are listed for group motor installation in compliance with the National Electrical Code section 430.53, which covers group motor installations. For example, the two or more motor overloads 102 within the motor overload enclosure 118 may be listed for group motor installation in compliance with the National Electrical Code section 430.53 for the 2011 edition of the National Electrical Code as well as for future editions with a similar requirement as section 430.53 of the 2011 edition of the National Electrical Code. In one embodiment, the motor overloads 102 have a specified maximum rating of a fuse, an inverse time circuit breaker, or both, in compliance with NEC 430.53. In a group motor installation, in one embodiment, the two or more motors 104 are controlled by a single motor controller 110, as depicted in FIG. 2. In the embodiment, typically each output conductor of the motor controller 110 is divided to feed each of the two or more motors 104. For example, the terminal block 108 may be used to divide the conductors at the output of the motor controller 110.

In another embodiment (not shown), the apparatus 200 may not have a single motor controller and each motor (e.g. 104a) may include a manual motor controller. For example, the branch circuit conductors 116 might directly feed the terminal block 108 and a manual motor controller may be inserted between the terminal block 108 and a motor overload 102a. One of skill in the art will recognize other configurations compliant with NEC 430.53 or other group motor installation requirement where two or more motor overloads 102 are in a motor overload enclosure 118.

Figure 3:
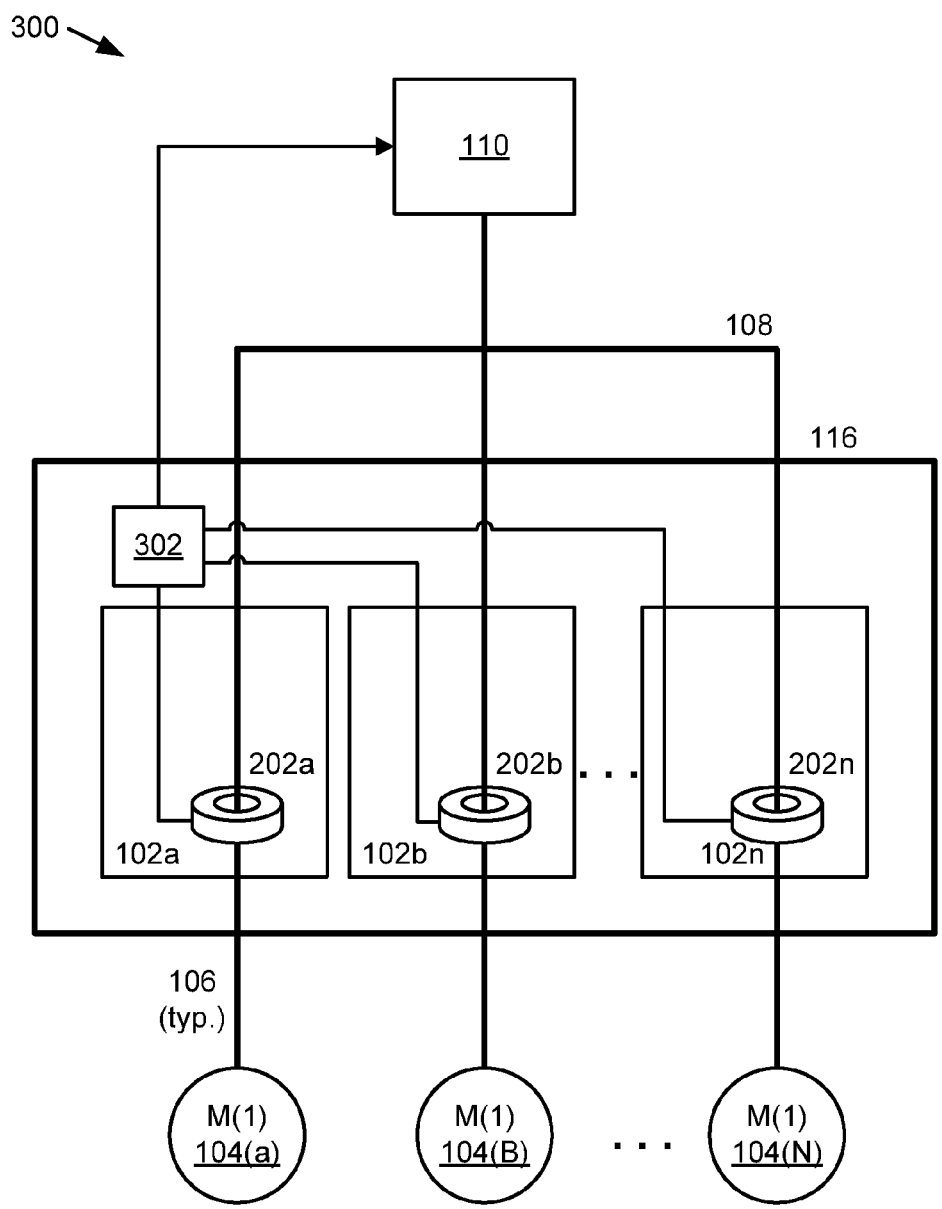
FIG. 3 is a schematic one-line diagram illustrating another embodiment that includes an alternate apparatus for motor protection.

FIG. 3 is a schematic one-line diagram illustrating another embodiment that includes an alternate apparatus 300 for motor protection. The apparatus 300 includes two or more motor overloads 102 combined within a motor overload enclosure 118, which are substantially similar to those described in the system 100 of FIG. 1 and the apparatus 300 of FIG. 2. FIG. 3 also depicts two or more motors 104, conductors 106 feeding the motors, a terminal block 108 and a motor controller 110, which are substantially similar to those described in the system 100 of FIG. 1 and the apparatus 200 of FIG. 2. The apparatus 300 also includes a current sensor 202a-202n (collectively 202) in each motor overload 102 and a single motor trip module 302, which is described below.

In the apparatus 300, the functions described above for the motor trip modules 204a-204n in each motor overload 102a-102n may be combined in a single motor trip module 302 in the motor overload enclosure 118. In another embodiment, some functions of the motor trip modules 204a-204n in each motor overload 102a-102n may remain in the individual motor overloads 102a-102n while other functions may be in the motor trip module 302 depicted in FIG. 3. Grouping motor overloads 102 in a motor overload enclosure 118, in one embodiment, allows some functions of current sensors 202a-202n, motor trip modules 204a-204n, etc. to be grouped together, which may be advantageous for minimizing circuits and parts used for motor overloads 102.

Figure 4:
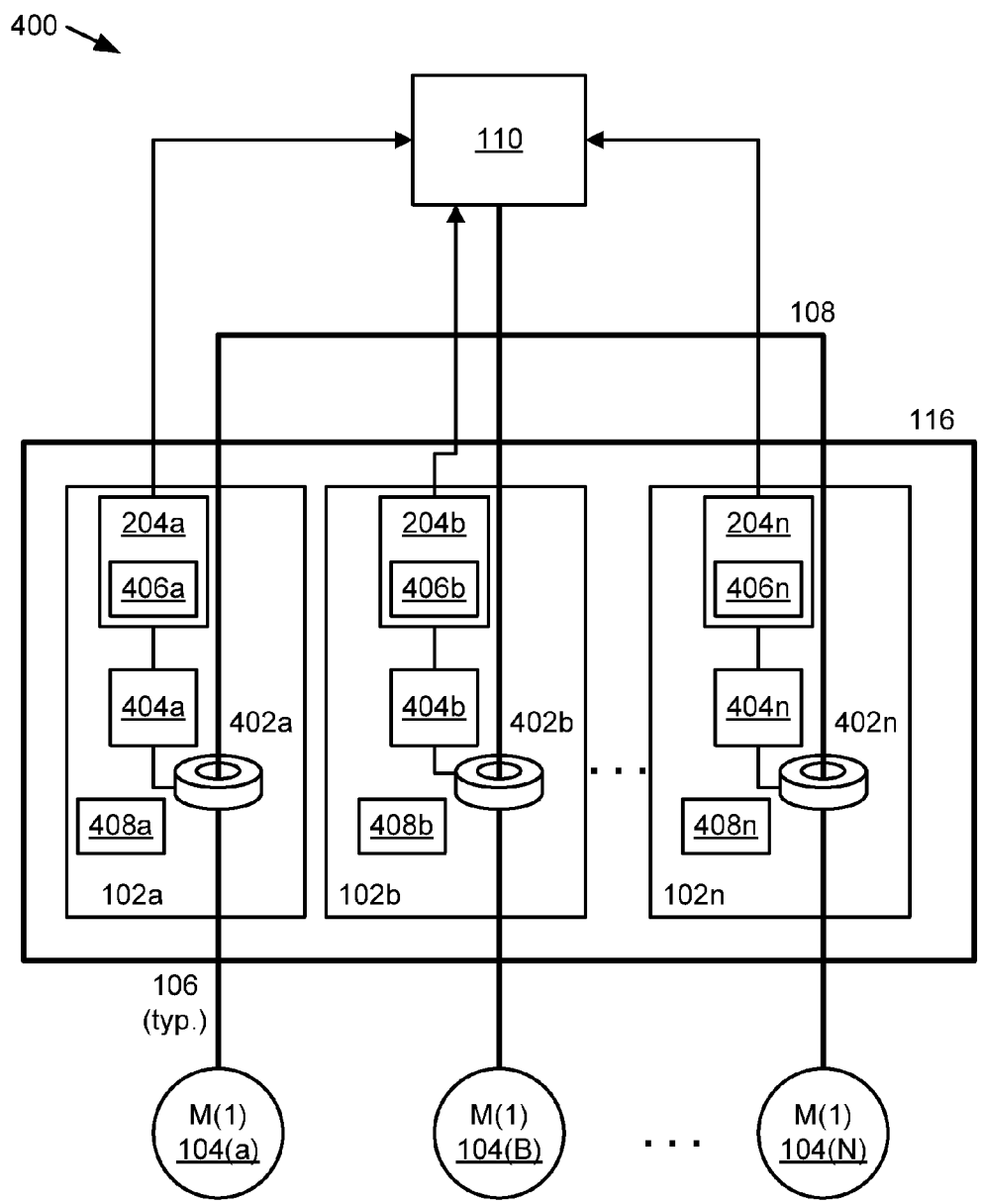
FIG. 4 is a schematic one-line diagram illustrating another embodiment that includes another alternate apparatus for motor protection.

FIG. 4 is a schematic one-line diagram illustrating another embodiment that includes another alternate apparatus 400 for motor protection. The apparatus 400 includes two or more motor overloads 102 combined within a motor overload enclosure 118, which are substantially similar to those described in the system 100 of FIG. 1 and the apparatus 200 of FIG. 2. FIG. 4 also depicts two or more motors 104, conductors 106 feeding the motors, a terminal block 108 and a motor controller 110, which are substantially similar to those described in the system 100 of FIG. 1 and the apparatus 200 of FIG. 2. The apparatus 400 also includes a motor trip module 204a-204n (collectively 204) in each motor overload 102 similar to those describe above in relation to the apparatuses 200, 300 of FIGS. 2 and 3. In addition, the apparatus 400 includes, in the motor overloads 102a-102n, a saturable core current sensor 402a-402n (collectively 402), a current reading module 404a-404n (collectively 404), a speed adjustment module 406a-406n (collectively 406), and an overload module 408a-408n (collectively 408), which are described below.

In one embodiment, the apparatus 400 includes, in a motor overload (e.g. 102a), a saturable core current sensor (e.g. 402a) where the closed magnetic core of the saturable core current sensor 402a saturates for at least a portion of a range of motor currents below a full load current of the protected motor 104a. For example, the magnetic core of the saturable core current sensor 402a may saturate for current above 50% of the full load current of the protected motor 104a.

The apparatus 400, in one embodiment, may also include a current reading module (e.g. 404a) that periodically drives the magnetic core of the saturable core current sensor 402a into an unsaturated state. The saturable core current sensor 402a then reads current of the magnetic core while the magnetic core is in the unsaturated state. The current reading module 404a may then release the saturable core current sensor 402a so the magnetic core in the saturable core current sensor 402a returns to a saturated state. In one embodiment, the current reading module 404a drives the magnetic core into the unsaturated state at a sampling rate where the sampling rate is at a frequency higher than a maximum fundamental frequency of an AC frequency of a voltage on the set of conductors 106 providing power to the protected motor 104a. For example, the current reading module 404a may have a sampling rate such that current of the protected motor 104a is read several times during a cycle of a frequency of a voltage on the set of conductors 106 feeding the protected motor 104a.

For example, where the motor controller 110 controlling the protected motor 104a is a variable frequency drive ("VFD"), the VFD may have a maximum frequency of 120 Hz and the sampling rate of the current reading module 404a may be 1200 Hz. When the VFD is running at 120 Hz and the sampling rate is 1200 Hz, the saturated core current sensor 402a may sample motor current of the protected motor 104a ten times per cycle. When the VFD is running at 60 Hz and the sampling rate is again 120 Hz, the saturated core current sensor 402a may sample motor current of the protected motor 104a twenty times per cycle. Sampling rates much higher than a maximum fundamental frequency of the motor controller 110 controlling the protected motor 104*a* may be desirable to more accurately read motor current. In another embodiment, where DC motors 104 are used, the sampling rate may be at a rate convenient to determine a thermal state of the motors 104. One of skill in the art will recognize other sampling rates appropriate for reading motor current.

In one embodiment, the magnetic core of a saturable core current sensor (e.g. 402*a*) may include at least one winding used by the corresponding current reading module 404*a* to drive the magnetic core into an unsaturated state. The current reading module 404*a* may include other circuitry connected to the winding to facilitate driving the magnetic core into the unsaturated state. For example, the current reading modules 404 and saturable core current sensors 402 may include circuits as described in U.S. Patent Publication No. 2012/0194171, filed Feb. 2, 2011 for John Herman Blakely, and titled "Active Core Current Sensor" [hereinafter "Blakely"]. The current reading modules 404 and saturable core current sensors 402 may include circuits as shown in FIGS. 4 and/or 6 of Blakely and may include a voltage source, diodes, zener diodes, switches, an analog-to-digital converter, measurement circuitry, etc. as shown and described in Blakely. Blakely describes in detail at least one way for the saturable core current sensors 402 and current reading module 404 to implement a saturable core current reading technique. One of skill in the art will recognize other variations that drive a saturable magnetic core to an unsaturated state, read current while in the unsaturated state, and release the magnetic core to return to a saturated state.

The apparatus 400 includes a speed adjustment module (e.g. 406*a*) in a motor trip module 204*a* for a protected motor 104*a* that adjusts the thermal limit as a function of motor speed. The speed adjustment module 406*a* adjusts the thermal limit as a function of motor speed by accounting for a reduced or different cooling effect when the protected motor operates at a speed above or below a rated full speed. As described above, the protected motors 104 may experience different cooling when running at a speed different than a rated motor speed. The different cooling affects the thermal state of the protected motor 104*a*. For example, where a protected motor 104*a* includes blades or other mechanism connected to a motor shaft of the protected motor 104*a*, when the protected motor 104*a* is running at a speed lower than a full speed the protected motor 104*a* may have less cooling and a thermal limit for the protected motor 104*a* may be reduced at the lower speed.

The speed adjustment module 406*a*, in one embodiment, uses a speed signal to adjust the thermal limit of the protected motor 104*a*. For example, the speed adjustment module 406*a* may determine a speed of the protected motor 104*a* from a fundamental frequency of a voltage on the set of conductors 106 feeding the protected motor 104*a*. In another example, the speed adjustment module 406*a* uses a signal from the motor controller 110 controlling speed of the protected motor 104*a*. For instance, where the motor controller 110 is a VFD, the VFD may include a signal proportional to motor speed that may be used by the speed adjustment module 406*a*. In another embodiment, the speed adjustment module 406*a* uses a speed signal from the protected motor 104*a*. For instance, the protected motor 104*a* may have a speed measurement signal that may be used by the speed adjustment module 406*a*. One of skill in the art will recognize other ways that the speed adjustment module 406*a* may determine speed of the protected motor 104*a*.

The speed adjustment module 406*a* may include data that correlates motor speed with a thermal limit. The data, in one embodiment, comes from the manufacturer of the protected motor 104*a*. The data may be a lookup table, a function, a matrix, a database, or other type of data structure.

The apparatus 400, in one embodiment, includes an overload module (e.g. 408*a*) that displays a reading of how close the protected motor 104*a* is to reaching the thermal limit. For example, a current signal representing motor current from the current sensor 202*a* sensing current for the protected motor 104*a* may be made available for display or for use in another function. The overload module 408*a* may use the current signal to determine a thermal state of the protected motor 104*a*. The overload module 408*a* may then display, in some form, the thermal state of the protected motor 104*a* along with a current thermal limit. For example, the overload module 408*a* may display a percentage representing how close the thermal state of the protected motor 104*a* is to reaching the current thermal limit. The overload module 408*a* may also display a thermal state of the protected motor 104*a* and the thermal limit.

The overload module 408*a* may also display other information, such as motor current. The overload module 408*a* may display information and/or may export information for display, for example, on a computer monitor. The overload module 408*a* may include drivers and other hardware and/or software to export one or more signals or to display information. In one embodiment, a portion of the overload module 408*a* may be located external to a motor overload 102*a* or a motor overload enclosure 118. One of skill in the art will recognize other information that may be displayed or exported from a motor overload 102*a*.

Note that all or a portion of the saturable core current sensors 402, the current reading modules 404, the speed adjustment modules 406, and the overload modules 408 may be combined in a similar way as the motor trip module 302 described in the apparatus 300 of FIG. 3. One of skill in the art will recognize other ways to combine functions of the modules 204, 302, 404, 406, 408 and components 102, 202 described herein. In addition, where a single module or component is describes (i.e. 102*a*, 104*a*, 202*a*, 204*a*, 402*a*, 404*a*, 406*a*, 408*a*), one of skill in the art will recognize that the description herein may be equally applicable to the other modules and components depicted in FIGS. 1-4 (i.e. 102*b*-102*n*, 104*b*-104*n*, 202*b*-202*n*, 204*b*-204*n*, 402*b*-402*n*, 404*b*-404*n*, 406*b*-406*n*, 408*b*-408*n*).

Figure 5:
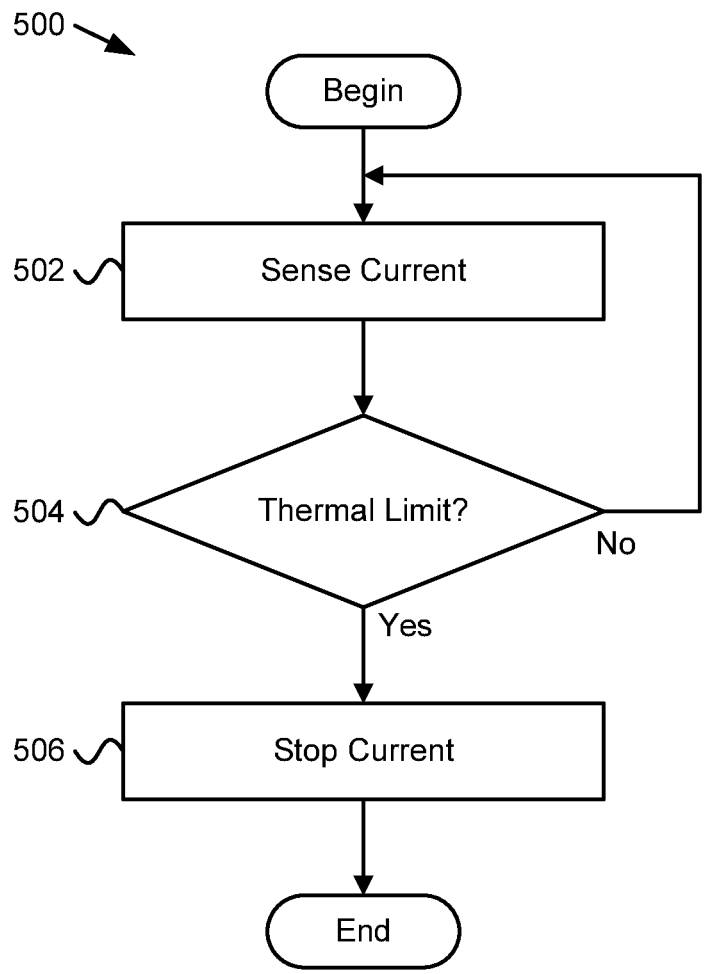
FIG. 5 is a schematic flow chart diagram illustrating one embodiment of a method for motor protection.

FIG. 5 is a schematic flow chart diagram illustrating one embodiment of a method 500 for motor protection. The method 500 begins and senses 502 current of a protected motor 104*a*. The protected motor 104*a* is a motor of two or more motors 104 and each of the two or more motors 104 are protected by a motor overload 102. Each motor overload 102 protecting the two or more motors 104 is located within a motor overload enclosure 118. In one embodiment, each motor overload 102 includes one or more current sensors 202 that sense current for the protected motor 104 and each current sensor 202 includes a closed magnetic core where each current sensor 202 includes a conductor positioned within the closed magnetic core and the conductor provides power to the protected motor 104. In one embodiment, the current sensor 202 senses 502 motor current.

The method 500 determines 504 if a thermal state of the protected motor 104 has reached a thermal limit for the protected motor 104. Determining a thermal state of the protected motor 104 includes using a current signal from at least one current sensor of the one or more current sensors 202 that senses current of the protected motor 104 to determine the thermal state of the protected motor 104. For example, the motor trip module 204 may determine the thermal state of the protected motor 104. If the method 500 determines 504 that the thermal state of the protected motor 104 has not reached a thermal limit for the protected motor 104, the method 500 returns and senses 502 motor current. If the method 500 determines 504 that the thermal state of the protected motor 104 has reached a thermal limit for the protected motor 104, the method stops 506 current flow to the protected motor 104, and the method ends. In one embodiment, the motor trip module 204 stops 506 current to the protected motor 104, for example by sending a signal to the motor controller 110.

Figure 6:
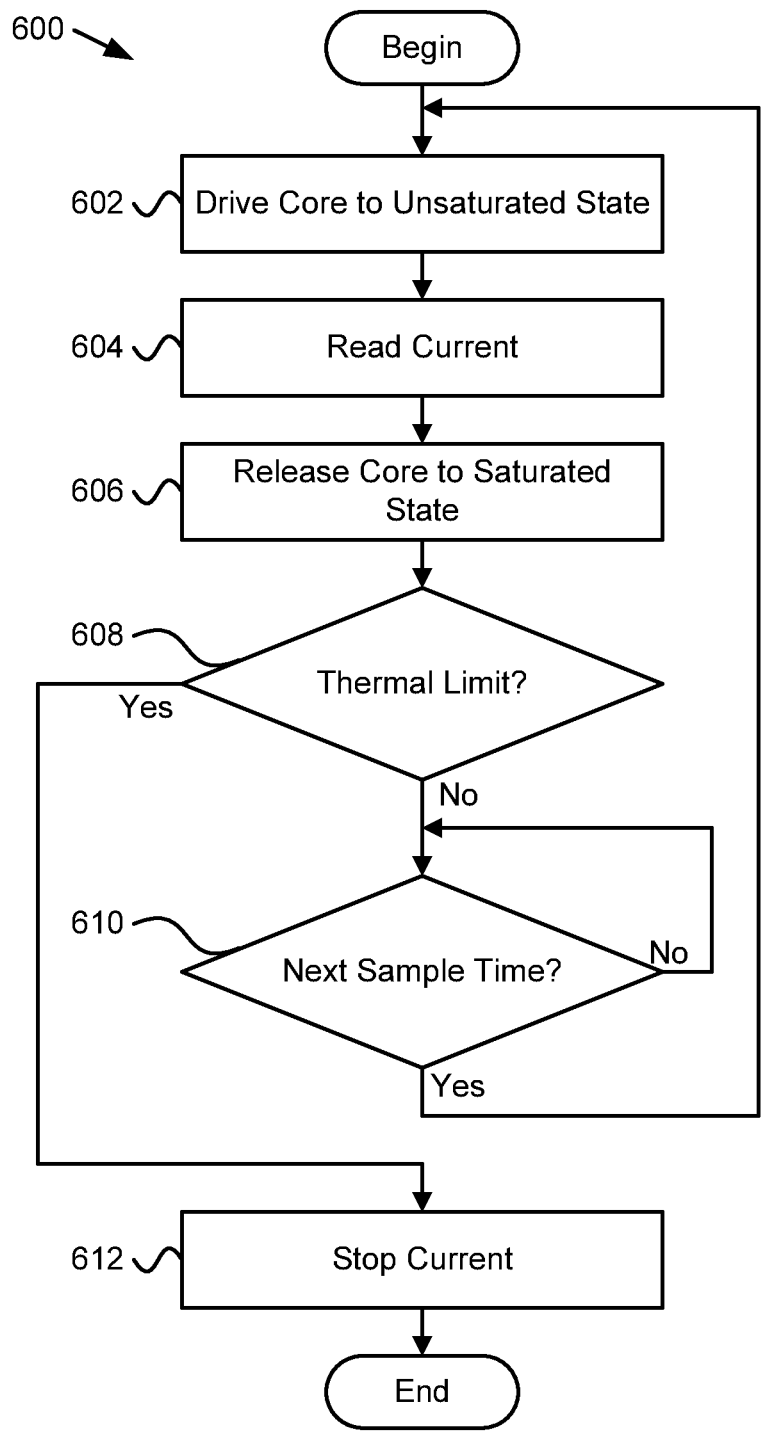
FIG. 6 is a schematic flow chart diagram illustrating another embodiment of a method for motor protection.

FIG. 6 is a schematic flow chart diagram illustrating another embodiment of a method 600 for motor protection. The method 600 begins and drives 602 a magnetic core of a saturable core current sensor 402 to an unsaturated state and reads 604 motor current of a protected motor 104. The method 600 then releases 606 the magnetic core so the magnetic core returns to a saturated state. In one embodiment, the current reading module 404 drives 602 the magnetic core to an unsaturated state and releases 606 the magnetic core to return to the saturated state and the saturable core current sensor 402 reads 604 motor current.

The method 600 determines 608 if the thermal state of the protected motor 104 has reached a thermal limit. If the method 600 determines 608 that the thermal state of the protected motor 104 has not reached the thermal limit, the method 600 determines 610 if a next sample time has been reached. If the method 600 determines 610 that the next sample time has not been reached, the method 600 again determines 610 if the next sample time has been reached. If the method 600 determines 610 that the next sample time has been reached, the method 600 returns and drives 602 the magnetic core to an unsaturated state. If the method 600 determines 608 that the thermal state of the protected motor 104 has reached the thermal limit, the method 600 stops 612 current flow to the protected motor 104, and the method 600 ends. In one embodiment, the current reading module 404 determines 610 if the next sample time has been reached and the motor trip module 204 determines 608 if the protected has reached a thermal limit and stops 612 current to the protected motor 104.

The described examples and embodiments are to be considered in all respects only as illustrative and not restrictive. This written description uses examples and embodiments to disclose the invention, including best mode, and also to enable any person skilled in the art to practice the invention, including making and using any devices or systems and performing any incorporated methods. The examples and embodiments may be practiced in other specific forms. The patentable scope of this invention is defined by the claims and may include other examples that occur to those skilled in the art. Such other examples are intended to be within the claims if they have structural elements that do not differ from the literal language of the claims, or if they include equivalent structural element with insubstantial differences from the literal languages of the claims.

What is claimed is:

1. An apparatus comprising:
a motor overload enclosure; and
two or more motor overloads protecting two or more alternating current ("AC") motors, each motor overload of the two or more motor overloads located within the motor overload enclosure, each of the two or more motor overloads being external to an enclosure housing a motor of the two or more motors, each motor overload comprising
one or more current sensors, each current sensor comprising a magnetic core, each current sensor comprising a conductor positioned within the magnetic core, the conductor providing power to a motor protected by the two or more motor overloads ("protected motor"); and
a motor trip module that stops current flow to the protected motor in response determining that a thermal state of the protected motor has reached a thermal limit, wherein determining that the protected motor has reached a thermal limit comprises using a current signal from at least one current sensor of the one or more current sensors that senses current of the protected motor to determine a thermal state of the protected motor,
wherein the two or more motors are controlled by a single motor controller, wherein each output conductor of the motor controller is divided to feed each of the two or more motors.

2. The apparatus of claim 1, wherein the two or more motor overloads within the motor overload enclosure are listed for group motor installation with the National Electrical Code section 430.53.

3. The apparatus of claim 1, wherein the motor controller comprises a variable frequency drive.

4. The apparatus of claim 1, wherein each current sensor of the two or more current sensors senses current of a motor within a full current range of the motor while the motor operates within a frequency range of the current from direct current ("DC") to a current with a fundamental frequency that is at least a full rated frequency of the motor.

5. The apparatus of claim 1, wherein the motor controller and the two or more motor overloads are within a common enclosure.

6. The apparatus of claim 1, wherein power used by the motor controller to power the two or more motors comes from a set of conductors protected by a single branch circuit overcurrent protection device.

7. The apparatus of claim 1, wherein a summation of rated currents for each of the two or more motors is less than or equal to a current rating for the motor controller.

8. The apparatus of claim 1, wherein the current sensor comprises a closed magnetic core and wherein the closed magnetic core comprises saturable core current sensor, wherein the current sensor measures direct current ("DC") and AC current.

9. The apparatus of claim 8, wherein the closed magnetic core of the saturable core current sensor saturates for at least a portion of a range of motor currents below a full load current of the protected motor and further comprising a current reading module that periodically drives the magnetic core of the saturable core current sensor into an unsaturated state, the saturable core current sensor reading current of the magnetic core while the magnetic core is in the unsaturated state, the current reading module driving the magnetic core into the unsaturated state at a sampling rate, the sampling rate at a frequency higher than a maximum fundamental frequency of an alternating current ("AC") frequency of a voltage on the conductors providing power to the protected motor.

10. The apparatus of claim 1, wherein the one or more current sensors for the motor overload protecting the protected motor comprise a current sensor for each line voltage phase providing power to the protected motor.

11. The apparatus of claim 1, wherein the motor trip module comprises a speed adjustment module that adjusts the thermal limit as a function of motor speed.

12. The apparatus of claim 11, wherein the speed adjustment module adjusts the thermal limit as a function of motor speed by accounting for a reduced cooling effect when the protected motor operates at a speed below a rated full speed.

13. The apparatus of claim 1, wherein each motor trip module stops flow to the protected motor by one of:
adjusting power to a coil of a contactor of a motor starter to open the contactor; and
commanding a variable frequency drive powering the two or more motors to a state where power to the two or more motors is interrupted.

14. The apparatus of claim 1, wherein the two or more motors are of different sizes.

15. The apparatus of claim 1, further comprising an overload module that displays a reading of how close the protected motor is to reaching the thermal limit.

16. A method comprising:
sensing current for a protected motor, the protected motor comprising a motor of two or more alternating current ("AC") motors, each of the two or more motors protected by a motor overload, each motor overload protecting the two or more motors within a motor overload enclosure, each motor overload comprising one or more current sensors that sense current for the protected motor, each current sensor comprising a magnetic core, each current sensor comprising a conductor positioned within the magnetic core, the conductor providing power to the protected motor;
determining a thermal state of the protected motor, wherein determining a thermal state of the protected motor comprises using a current signal from at least one current sensor of the one or more current sensors that senses current of the protected motor to determine the thermal state of the protected motor; and
stopping current flow to the protected motor in response determining that the thermal state of the protected motor has reached a thermal limit,
wherein the two or more motors are controlled by a single motor controller, wherein each output conductor of the motor controller is divided to feed each of the two or more motors.

17. The method of claim 16, wherein the magnetic core comprises a closed magnetic core and wherein the closed magnetic core comprises a saturable magnetic core, the saturable magnetic core saturating for at least a portion of a range of motor currents below a full load current of the protected motor, and wherein sensing current for the protected motor further comprises:
driving the saturable magnetic core into an unsaturated state at a sampling time, each sampling time occurring at a sampling rate, the sampling rate at a frequency higher than a maximum fundamental frequency of an alternating current ("AC") frequency of a voltage on the conductors providing power to the protected motor;
reading current of the saturable magnetic core while the magnetic core is in the unsaturated state; and
releasing the saturable magnetic core into a saturated state until a next sampling time.

18. A system comprising:
an enclosure;
a motor controller within the enclosure, the motor controller controlling two or more alternating current ("AC") motors, wherein each output conductor of the motor controller is divided to feed each of the two or more motors; and
two or more motor overloads protecting the two or more motors, each motor overload located within the motor overload enclosure, each of the two or more motor overloads being external to an enclosure housing a motor of the two or more motors, each motor overload comprising
one or more current sensors, each current sensor comprising a magnetic core, each current sensor comprising a conductor positioned within the magnetic core, the conductor providing power to a motor protected by the two or more motor overloads ("protected motor"); and
a motor trip module that stops current flow to the protected motor in response determining that a thermal state of the protected motor has reached a thermal limit, wherein determining that the protected motor has reached a thermal limit comprises using a current signal from at least one current sensor of the one or more current sensors that senses current of the protected motor to determine a thermal state of the protected motor,
wherein the two or more motors are controlled by a single motor controller, wherein each output conductor of the motor controller is divided to feed each of the two or more motors.

19. The system of claim 18, further comprising the two or more motors protected by the thermal overloads.

* * * * *